(12) United States Patent
Han et al.

(10) Patent No.: US 9,691,838 B1
(45) Date of Patent: Jun. 27, 2017

(54) CHIP RESISTOR

(71) Applicant: SAMSUNG ELECTRO-MECHANICS CO., LTD., Suwon-si, Gyeonggi-do (KR)

(72) Inventors: Jin Man Han, Suwon-si (KR); Jang Seok Yun, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/229,564

(22) Filed: Aug. 5, 2016

(30) Foreign Application Priority Data

Dec. 18, 2015 (KR) .................. 10-2015-0181816

(51) Int. Cl.
*H01C 10/16* (2006.01)
*H01L 49/02* (2006.01)

(52) U.S. Cl.
CPC .................. *H01L 28/20* (2013.01)

(58) Field of Classification Search
CPC ......... H01C 1/14; H01C 1/1406; H01C 10/16
See application file for complete search history.

(56) References Cited

U.S. PATENT DOCUMENTS

| 6,097,276 A | 8/2000 | Van Den Broek et al. |
| 2013/0154790 A1 | 6/2013 | Park et al. |
| 2014/0049358 A1 | 2/2014 | Kim et al. |

FOREIGN PATENT DOCUMENTS

| JP | 07-302704 A | 11/1995 | |
| JP | 2001-118705 | * 4/2001 | ............... H01C 7/00 |
| JP | 2001-118705 A | 4/2001 | |
| JP | 2001-155902 A | 6/2001 | |
| JP | 2002-367804 A | 12/2002 | |
| KR | 10-2013-0070682 A | 6/2013 | |
| KR | 10-2014-0023819 A | 2/2014 | |

OTHER PUBLICATIONS

Korean Office Action dated Dec. 20, 2016, issued in Korean patent application No. 10-2015-0181816. (w/ English translation).

* cited by examiner

*Primary Examiner* — Jae Lee
(74) *Attorney, Agent, or Firm* — McDermott Will & Emery LLP

(57) ABSTRACT

A chip resistor includes a substrate having first and second electrodes disposed on one surface thereof to be separated from each other. A first resistor electrically connects the first electrode to the second electrode, and a second resistor electrically connects the first electrode to the second electrode. When temperatures of the first electrode and the second electrode are different from each other, thermo electromotive force generated from the first resistor is less than thermo electromotive force generated from the second resistor, and a temperature coefficient of resistivity (TCR) of the second resistor is lower than the TCR of the first resistor.

35 Claims, 6 Drawing Sheets

CHIP RESISTOR

CROSS-REFERENCE TO RELATED APPLICATION

This application claims the priority and benefit of Korean Patent Application No. 10-2015-0181816, filed on Dec. 18, 2015 with the Korean Intellectual Property Office, the disclosure of which is incorporated herein by reference.

BACKGROUND

The present disclosure relates to a chip resistor.

Recently, as a demand for miniaturization and lightness of electronic devices has gradually increased, a chip-shaped resistor has been widely used to increase wiring density on a circuit board.

As required power from the electronic device is increased and a demand for a chip resistor for current detection in a circuit is increased, a chip resistor having high precision while having a low resistance value is required. However, the chip resistor typically has characteristics resulting in decreased precision as the resistance value is decreased.

SUMMARY

An aspect of the present disclosure provides a chip resistor having high precision while having a low resistance value.

According to an exemplary embodiment, a chip resistor may include a substrate, a first electrode disposed on a surface of the substrate, a second electrode disposed on a surface of the substrate to be separated from the first electrode, a first resistor electrically connecting the first electrode to the second electrode, and a second resistor electrically connecting the first electrode to the second electrode. Thermo electromotive force generated from the first resistor is less than thermo electromotive force generated from the second resistor when temperatures of the first electrode and the second electrode are different from each other, and a temperature coefficient of resistivity (TCR) of the second resistor is lower than the TCR of the first resistor.

According to another exemplary embodiment, a chip resistor may include a substrate, a first electrode disposed on a surface of the substrate, a second electrode disposed on a surface of the substrate to be separated from the first electrode, and a plurality of resistors each disposed on a surface of the substrate to electrically connect the first electrode and the second electrode to each other and be electrically connected in parallel with each other. A first resistor of the plurality of resistors has a groove, and a second resistor of the plurality of resistors has an average temperature coefficient of resistivity (TCR) that is lower than an average TCR of the remaining resistors of the plurality of resistors.

According to a further exemplary embodiment, a method of forming a chip resistor having a predetermined resistance value includes forming on a substrate first and second electrodes disposed to be spaced apart from each other. A first resistor is disposed on the substrate to directly contact and electrically connect the first electrode and the second electrode. A second resistor is disposed on the substrate to electrically connect the first electrode to the second electrode, and a thermo electromotive force generated from the first resistor is lower than a thermo electromotive force generated from the second resistor when temperatures of the first electrode and the second electrode are different from each other. Finally, the first resistor having the lower electromotive force is trimmed to achieve the predetermined resistance value.

According to another exemplary embodiment, a chip resistor includes a substrate, a first electrode disposed on a surface of the substrate, a second electrode disposed on a surface of the substrate to be separated from the first electrode, and a plurality of resistors each disposed on a surface of the substrate to electrically connect the first electrode and the second electrode to each other and be electrically connected in parallel with each other. Additionally, a first resistor of the plurality of resistors has a temperature coefficient of resistivity (TCR) that differs from a TCR of a second resistor of the plurality of resistors.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
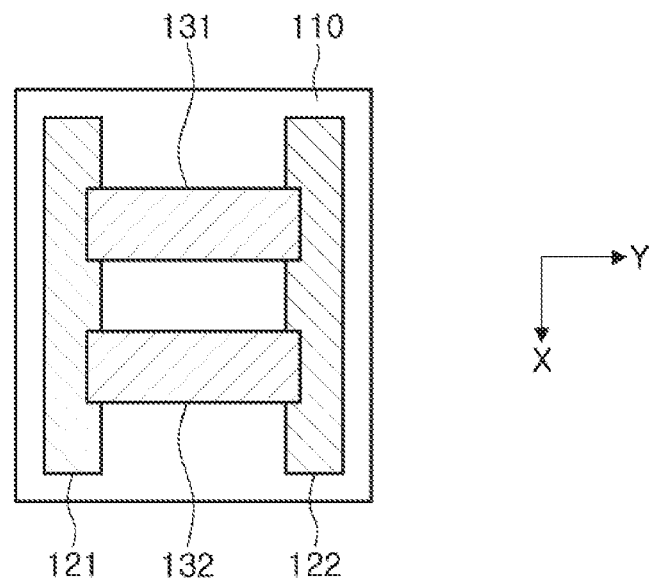
FIG. 1 is a view illustrating a chip resistor according to an exemplary embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region, or wafer (substrate) is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers, and/or sections, these members, components, regions, layers, and/or sections should not be limited by these terms. These terms are only used to distinguish one member, component, region, layer, or section from another member, component, region, layer, or section. Thus, a first member, component, region, layer, or section discussed below could be termed a second member, component, region, layer, or section without departing from the teachings of the exemplary embodiments.

Spatially relative terms, such as "above," "upper," "below," "lower," and the like, may be used herein for ease of description to describe one element's positional relationship relative to one or more other elements as shown in the figures. It will be understood that the spatially relative terms are intended to encompass different orientations of the device in use or operation in addition to the orientation depicted in the figures. For example, if the device in the figures is turned over, elements described as "above" or "upper" relative to other elements would then be oriented "below" or "lower" relative to the other elements or features. Thus, the term "above" can encompass both the above and below orientations depending on a particular direction of the devices, elements, or figures. The device may be otherwise oriented (rotated 90 degrees or at other orientations) and the spatially relative descriptors used herein may be interpreted accordingly.

The terminology used herein describes particular illustrative embodiments only, and the present disclosure is not limited thereby. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, members, elements, and/or groups, but do not preclude the presence or addition of one or more other features, integers, steps, operations, members, elements, and/or groups.

Hereinafter, embodiments of the present disclosure will be described with reference to schematic views illustrating embodiments. In the drawings, components having ideal shapes are shown. However, variations from these ideal shapes, for example due to variability in manufacturing techniques and/or tolerances, also fall within the scope of the disclosure. Thus, embodiments of the present disclosure should not be construed as being limited to the particular shapes of regions shown herein, but should more generally be understood to include changes in shape resulting from manufacturing methods and processes. The following embodiments may also be constituted by one or a combination thereof.

The present disclosure describes a variety of configurations, and only illustrative configurations are shown herein. However, the disclosure is not limited to the particular illustrative configurations presented herein, but extends to other similar/analogous configurations as well.

FIG. 1 is a view illustrating a chip resistor according to an exemplary embodiment.

Referring to FIG. 1, a chip resistor according to an exemplary embodiment includes a substrate 110, a first electrode 121, a second electrode 122, a first resistor 131, and a second resistor 132.

The substrate 110 may provide a space for mounting the electrodes and the resistors. For example, the substrate 110 may be an insulating substrate formed of a ceramic material. The ceramic material may be alumina ($Al_2O_3$), but is not particularly limited as long as the material has excellent insulation, heat dissipation, and adhesion properties with the resistor.

The first electrode 121 may be disposed on one surface of the substrate 110.

The second electrode 122 may be disposed to be spaced apart from the first electrode 121 on the one surface of the substrate 110.

For example, the first and second electrodes 121 and 122 may be implemented to have a low resistance value, and may be formed using copper and/or a copper alloy.

The first resistor 131 and the second resistor 132 may each electrically connect between the first electrode 121 and the second electrode 122 on the one surface of the substrate 110. That is, the first resistor 131 and the second resistor 132 may be connected in parallel with each other between the first and second electrodes 121 and 122.

For example, an adhesive for increasing adhesion when the first and second resistors 131 and 132 are sintered may be attached between the first resistor 131 and the substrate 110 and between the second resistor 132 and the substrate 110. For example, the adhesive may be a resin material such as an epoxy, or the like, and may be a material having excellent heat dissipation properties including copper (Cu), nickel (Ni), or copper-nickel (Cu—Ni).

Here, the first and second resistors 131 and 132 may be alloyed by an ionic diffusion bonding when sintered and may be coupled to the substrate 110.

In addition, thermal characteristics of the first resistor 131 and thermal characteristics of the second resistor 132 may be different from each other.

That is, thermo electromotive force occurring from the first resistor 131 at a predetermined temperature may be less than the thermo electromotive force occurring from the second resistor 132 at the predetermined temperature. Here, thermo electromotive force refers to electromotive force occurring when temperatures of two connection points of the material have different values. Therefore, a predetermined temperature condition may include a temperature difference between specific points in the resistor. Here, the specific points may each be a contact point of the first or second electrode 121 or 122 of the first resistor 131, but are not particularly limited.

A total resistance value of the first and second resistors 131 and 132 may be finely adjusted by a trimming operation for the first resistor 131. Here, the trimming operation refers to an operation of adjusting a resistance value of the resistor by forming a groove in the resistor and measuring the resistance value of the resistor at the same time, and stopping the forming of the groove when the resistance value reaches a target resistance value. Accordingly, precision of the chip resistor's resistance value according to an exemplary embodiment may be increased.

Here, the resistor which is subjected to the trimming operation is preferably made of a material having low thermo electromotive force occurring in a predetermined thermal condition. In detail, the trimming operation may typically emit heat while forming the groove. The heat emitted from the resistor may cause thermo electromotive force in the resistor. In turn, the thermo electromotive force may cause a distortion during a process of measuring the resistance value of the resistor.

Accordingly, as the thermo electromotive force occurring in the predetermined thermal condition of the first resistor 131 is low, precision of the chip resistor according to an exemplary embodiment may be increased.

For example, the first resistor 131 may include copper-manganese-tin (Cu—Mn—Sn) for achieving desired thermo electromotive force characteristics.

However, in the resistor having the low thermo electromotive force occurring in the predetermined thermal condition, a temperature coefficient of resistivity (TCR) that characterizes the variation of the resistance value depending on a temperature change may be high. That is, the TCR of the first resistor 131 may be high.

If a total TCR of the first and second resistors 131 and 132 is high, precision of the first and second resistors 131 and 132 may be decreased. An effect of the TCR on the precision may be larger, as the resistance value of the first and second resistors 131 and 132 is low. Therefore, in a case in which the resistance value of the first and second resistors 131 and 132 is 100 mΩ or less, the total TCR of the first and second resistors 131 and 132 may need to be decreased.

The second resistor 132 may not be the resistor which is subjected to the trimming operation. In addition, even though the trimming operation is not performed for the second resistor 132, a final total resistance value may be adjusted later by the trimming operation for the first resistor 131. Therefore, the second resistor 132 may not be formed so as to have the low thermo electromotive force occurring in the predetermined thermal condition. In the resistor, thermo electromotive force characteristics and TCR characteristics may have a trade-off relationship.

Therefore, the TCR of the second resistor 132 may be lower than that of the first resistor 131. Accordingly, a total TCR of the first and second resistors 131 and 132 may be lower than the TCR of the first resistor 131.

For example, the second resistor 132 may include copper-nickel (Cu—Ni). That is, the second resistor 132 may decrease the TCR by including materials having low TCR such as constantan, manganin, nichrome, and the like. Therefore, the second resistor 132 may include a material such as copper-nickel-manganese (Cu—Ni—Mn) or nickel-chromium (Ni—Cr).

Accordingly, the chip resistor according to an exemplary embodiment may be implemented at high precision while having a low resistance value.

Figure 2:
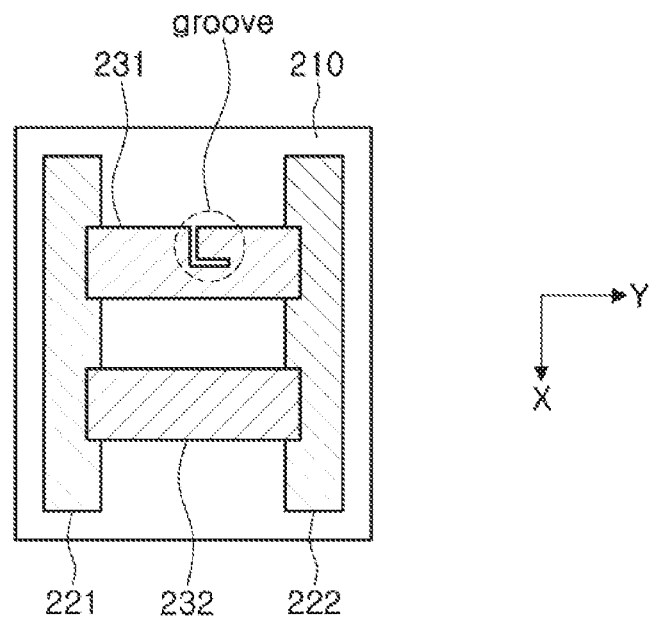
FIG. 2 is a view illustrating a groove formed in a resistor of the chip resistor according to an exemplary embodiment.

FIG. 2 is a view illustrating a groove formed in a resistor of the chip resistor according to an exemplary embodiment.

Referring to FIG. 2, a chip resistor according to an exemplary embodiment may include a substrate 210, a first electrode 221, a second electrode 222, a first resistor 231, and a second resistor 232.

The first resistor 231 may have a groove therein. For example, the groove may be formed by a laser. The laser may form the groove extending from an edge of the first resistor 231. In this case, the laser may extend a length of the groove while being slowly moved toward the center of the first resistor 231.

As the length of the groove is increased, a resistance value of the first resistor 231 may be increased. When the first resistor 231 includes three resistors that are connected in series with each other, a cross section area of a middle resistor may be decreased by the formation of the groove. Here, as the cross section area of the middle resistor is decreased, a resistance value of the middle resistor may be increased. As a result, a total of resistance value of the resistor may be increased.

In a case in which the resistance value of the first resistor 231 reaches a target resistance value, the laser may change a movement direction thereof. A rate of increase of the resistance value of the first resistor 231 according to the increase in the length of the groove after the change in the movement direction of the laser may be lower than a rate of increase of the resistance value of the first resistor 231 according to the increase in the length of the groove before the change in the movement direction of the laser. Therefore, after the movement direction of the laser is changed, the resistance value of the first resistor 231 may be more precisely adjusted.

Here, the groove may have an "L" shape, as shown in FIG. 2. In addition, in order to reduce an effect on the second resistor 232 during a process of forming the groove, the groove may be formed in an edge of the first resistor that is opposite to another edge of the first resistor that is closest to (and/or faces) the second resistor.

Figure 3:
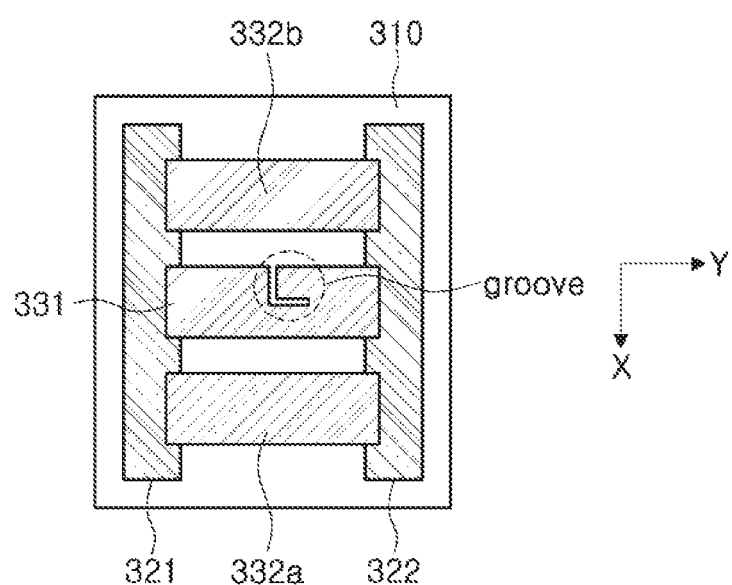
FIG. 3 is a view illustrating a layout of a resistor of a chip resistor according to an exemplary embodiment.

FIG. 3 is a view illustrating a layout of a resistor of a chip resistor according to an exemplary embodiment.

Referring to FIG. 3, a chip resistor according to an exemplary embodiment may include a substrate 310, a first electrode 321, a second electrode 322, a first resistor 331, and second resistors 332a and 332b.

As the TCR is low, the resistor may typically have excellent heat dissipation properties. Therefore, the heat dissipation properties of the second resistors 332a and 332b may be higher than that of the first resistor 331.

Therefore, the first resistor 331 may be disposed between the second resistors 332a and 332b. Accordingly, heat generated when a current flows in the first resistor 331 may be efficiently diffused through the second resistors 332a and 332b.

Figure 4A:
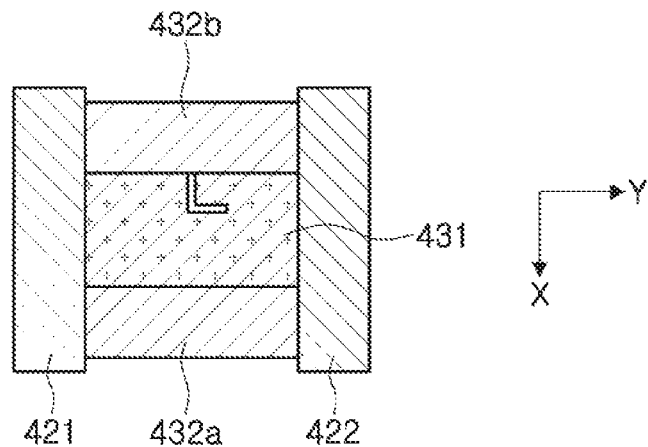
FIG. 4A is a rear view illustrating a layout of a resistor of a chip resistor according to an exemplary embodiment.

FIG. 4A is a rear view illustrating a layout of a resistor of a chip resistor according to an exemplary embodiment.

Figure 4B:
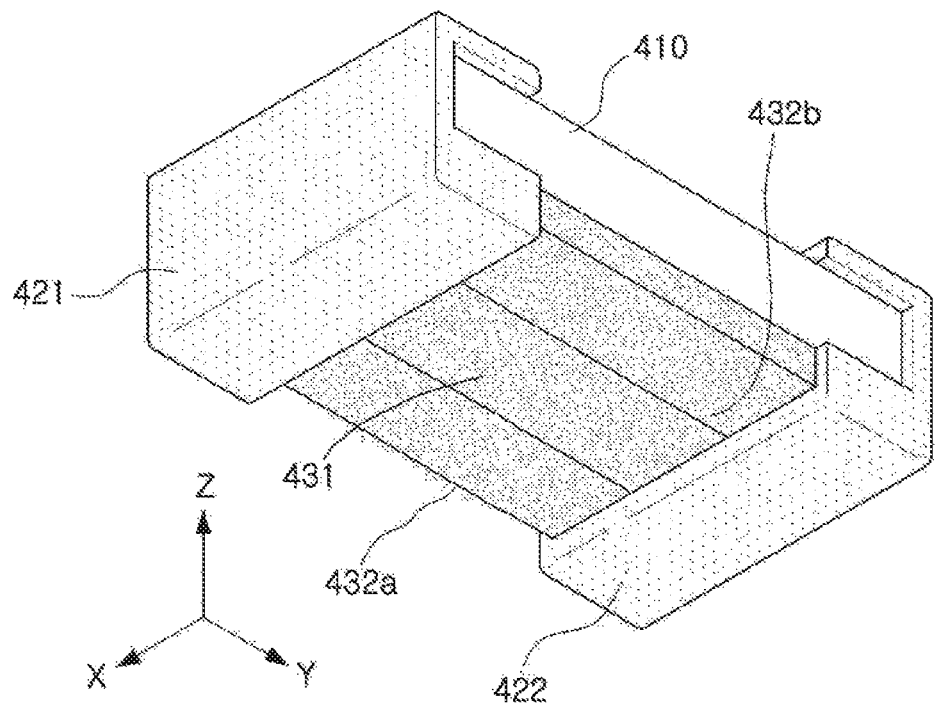
FIG. 4B is a perspective view of the chip resistor illustrated in FIG. 4A.

FIG. 4B is a perspective view of the chip resistor illustrated in FIG. 4A.

Referring to FIGS. 4A and 4B, a chip resistor according to an exemplary embodiment may include a substrate 410, a first electrode 421, a second electrode 422, a first resistor 431, and second resistors 432a and 432b.

The first resistor 431 and the second resistors 432a and 432b may be implemented by a thin film. Therefore, as widths (measured in an x direction) of the first resistor 431 and the second resistors 432a and 432b are long or lengths (measured in a y direction) thereof are short, resistance values of the first resistor 431 and the second resistors 432a and 432b may be decreased.

In order to increase the widths (measured in the x direction) of the first resistor 431 and the second resistors 432a and 432b, the first resistor 431 and the second resistors 432a and 432b may be in contact with each other. Accordingly, the chip resistor according to an exemplary embodiment may be easily implemented to have the resistance value of 100 mΩ or less.

Here, in order to efficiently diffuse heat generated by a current flowing in the first resistor 431 and the second resistors 432a and 432b, the first resistor 431 and the second resistors 432a and 432b may be alternately and repeatedly arranged.

Meanwhile, the first and second electrodes 421 and 422 may be formed to cover side surfaces of the substrate 410. A description thereof will be provided when a bottom surface electrode is described with reference to FIG. 5.

Figure 5:
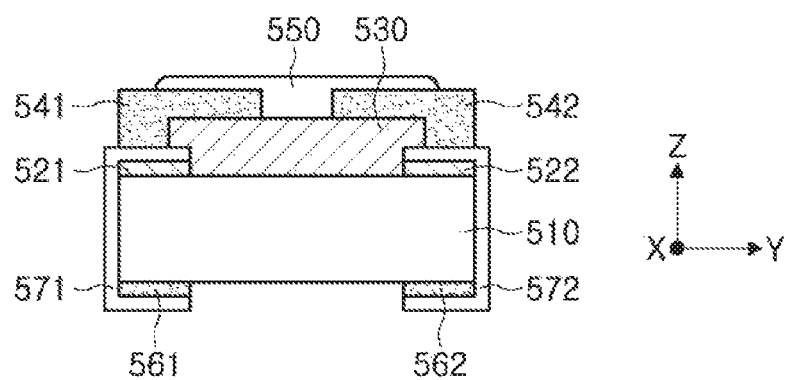
FIG. 5 is a view illustrating a side surface of a chip resistor according to an exemplary embodiment.

FIG. 5 is a view illustrating a side surface of a chip resistor according to an exemplary embodiment.

Referring to FIG. 5, a chip resistor according to an exemplary embodiment may include a substrate 510, a first electrode 521, a second electrode 522, a resistor 530, a first upper surface electrode 541, a second upper surface electrode 542, a protection layer 550, a first bottom surface electrode 561, a second bottom surface electrode 562, a first metal cover 571, and a second metal cover 572.

The first and second upper surface electrodes 541 and 542 may be disposed on an upper surface of at least one of the first electrode 521, the second electrode 522, and the resistor 530. In a case in which the first and second upper surface electrodes 541 and 542 are disposed on the first and second electrodes 521 and 522, respectively, the first and second upper surface electrodes 541 and 542 may serve as wirings for receiving a current from the outside or providing the current to the outside. In a case in which the first and second upper surface electrodes 541 and 542 are disposed on the resistor 530, the first and second upper surface electrodes 541 and 542 may efficiently emit heat generated from the resistor 530 using high thermal conductivity which is a property of a metal.

The protection layer 550 may cover an upper surface of at least one of the first electrode 521, the second electrode 522, the resistor 530, the first upper surface electrode 541, and the second upper surface electrode 542. For example, the protection layer 550 may be formed of an epoxy, a phenol resin, a glass material, or the like to protect the chip resistor from external physical impact.

The first and second bottom surface electrodes 561 and 562 may assist a layout of the first and second electrodes 521 and 522, respectively. For example, the first and second metal covers 571 and 572 having a shape of U may be inserted into or around both side surfaces of the substrate 510. The first and second metal covers 571 and 572 may press the first and second electrodes 521 and 522 so as to be fixed, and may serve as connecting electrodes providing electrical connections between the top and bottom surfaces of the substrate 510. Here, the first and second bottom surface electrodes 561 and 562 may be formed on the other surface of the substrate 510 in advance so as to be pressed by the first and second metal covers 571 and 572. Accordingly, the first and second electrodes 521 and 522 may be stably fixed. In addition, as a total area of the first and second bottom surface electrodes 561 and 562 and the first and second electrodes 521 and 522 is increased, a resistance value of the first and second electrodes may be further decreased. Accordingly, a total resistance value of the chip resistor according to an exemplary embodiment may be further decreased.

Figure 6:
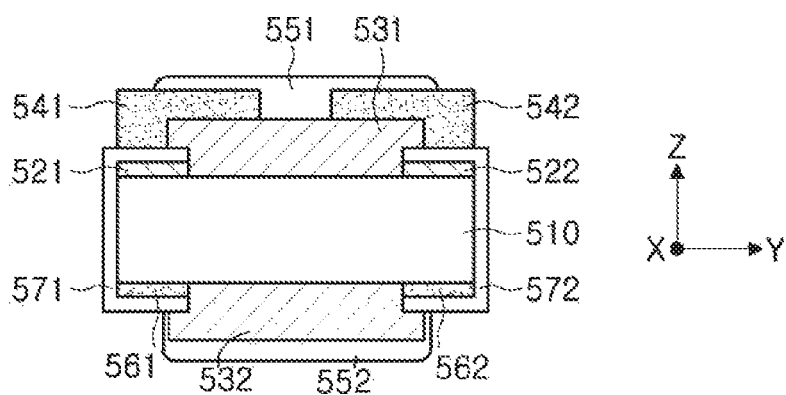
FIG. 6 is a view illustrating a side surface of a chip resistor having resistors disposed on opposing surfaces thereof according to an exemplary embodiment.

FIG. 6 is a view illustrating a side surface of a chip resistor having resistors disposed on opposing surfaces thereof according to an exemplary embodiment.

Referring to FIG. 6, a chip resistor according to an exemplary embodiment may include the substrate 510, the first electrode 521, the second electrode 522, a first resistor 531, a second resistor 532, the first upper surface electrode 541, the second upper surface electrode 542, a first protection layer 551, a second protection layer 552, the first bottom surface electrode 561, the second bottom surface electrode 562, the first metal cover 571, and the second metal cover 572.

The first resistor 531 may be disposed on one surface of the substrate 510 to be directly connected to the first and second electrodes 521 and 522. The first protection layer 551 may be formed on one surface of the first resistor 531.

The second resistor 532 may be disposed on another surface of the substrate 510 (e.g., another surface that is opposite to the one surface having the first resistor 531 thereon) to be directly connected to the first and second bottom surface electrodes 561 and 562. The second protection layer 552 may be formed on one surface of the second resistor 532.

The first electrode 521 and the first bottom surface electrode 561 may be electrically connected to each other through the first metal cover 571, and the second electrode 522 and the second bottom surface electrode 562 may be electrically connected to each other through the second metal cover 572. Accordingly, the first resistor 531 disposed on one surface of the substrate 510 and the second resistor 532 disposed on the other surface of the substrate 510 may be electrically coupled in parallel with each other.

As the first resistor 531 and the second resistor 532 are disposed on different surfaces, a width of the substrate 510 may be decreased. In addition, when the first and second resistors 531 and 532 including different components are formed, a net effect of each resistor's operational characteristics on the chip resistor may be decreased.

Figure 7:
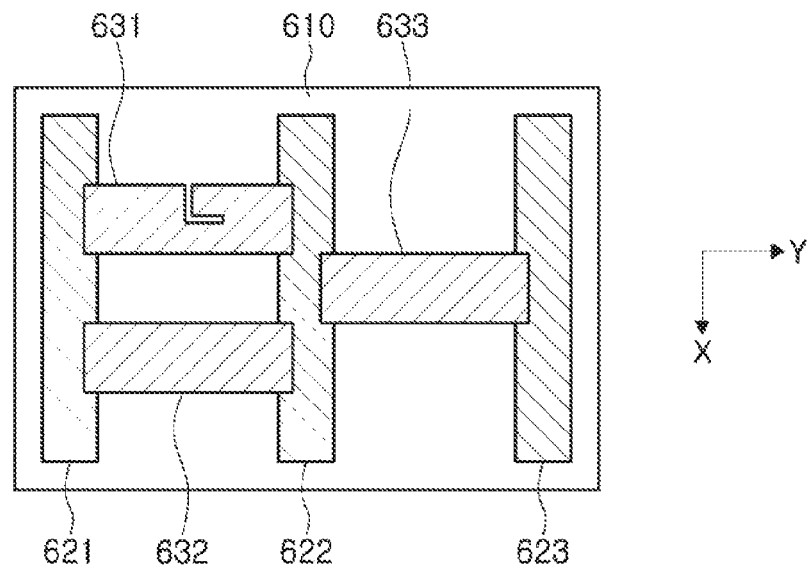
FIG. 7 is a view illustrating a three-terminal form of a chip resistor according to an exemplary embodiment.

FIG. 7 is a view illustrating a three-terminal form of a chip resistor according to an exemplary embodiment.

Referring to FIG. 7, a chip resistor according to an exemplary embodiment may include a substrate 610, a first electrode 621, a second electrode 622, a third electrode 623, a first resistor 631, a second resistor 632, and a third resistor 633.

The third electrode 623 may be disposed to be spaced apart from the first and second electrodes 621 and 622 on one surface of the substrate 610. For example, the third electrode 623 may be formed of the same material, form or shape, and method as those of the first and second electrodes 621 and 622.

The third resistor 633 may electrically connect between the third electrode 623 and the second electrode 622.

The third electrode 623 may be electrically connected to the first electrode 621 from the outside to serve as a preliminary electrode for the first electrode 621. In a case in which the first electrode 621 is disconnected from the outside by a defect occurring during a process of manufacturing the chip resistor or impact occurring during a process of using the chip resistor, the third electrode 623 may instead perform a role of the first electrode 621.

Therefore, the third resistor 633 may also be implemented by a plurality of resistors having different thermal characteristics in order to have the same characteristics as the first and second resistors 631 and 632.

Figure 8:
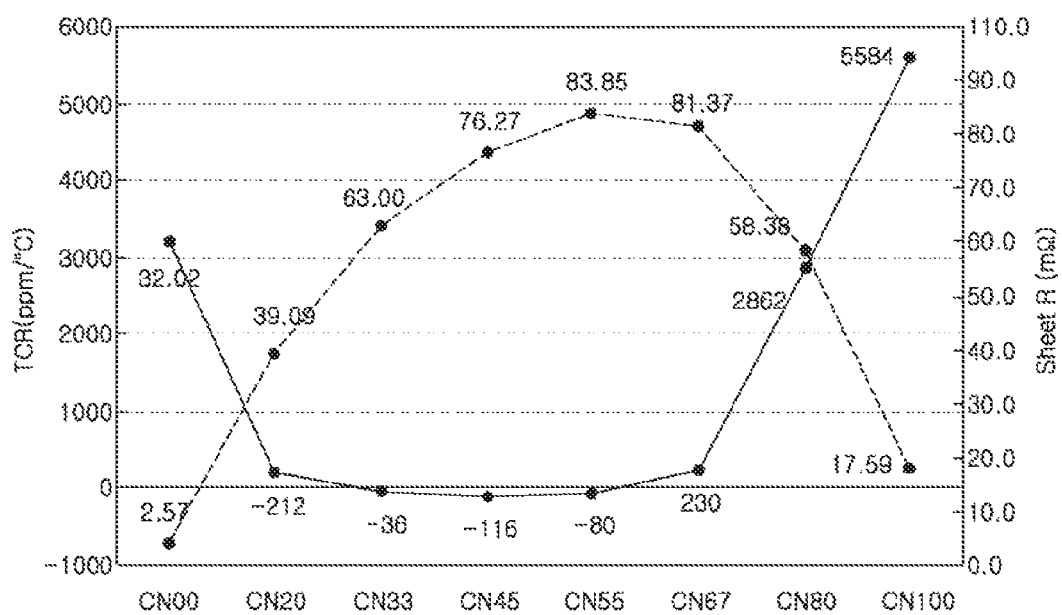
FIG. 8 is a graph illustrating a temperature coefficient of resistivity (TCR) and resistance according to a ratio of nickel (Ni) in a second resistor.

FIG. 8 is a graph illustrating a temperature coefficient of resistivity (TCR) and resistance according to a ratio of nickel (Ni) in a second resistor.

Referring to FIG. 8, numbers following CN of a horizontal axis denote numbers obtained by multiplying a ratio of nickel (Ni) of copper-nickel (Cu—Ni) by 100. In addition, the TCR of a vertical axis denotes a temperature coefficient of resistivity using a unit of ppm/temperature.

The resistor, which has a TCR in the range of thousands of ppm/temperature, may have characteristics that when a temperature thereof is increased as much as 10, a resistance value thereof is increased as much as a few mΩ. Here, in a case in which the resistance value of the resistor is tens of mΩ, the resistor may have characteristics that the resistance value changes by about 10% even though the temperature is changed as much as only 10. Therefore, in order for the chip resistor having the resistance value of 100 mΩ or less to have a precise resistance value, an absolute value of a total of TCR may need to be decreased.

The chip resistor according to an exemplary embodiment may have a structure in which a resistor capable of performing a trimming operation and a resistor including copper-nickel (Cu—Ni) are connected in parallel with each other. Here, it may be difficult to adjust the TCR of the resistor capable of performing the trimming operation. Therefore, by adjusting the TCR of the resistor including copper-nickel (Cu—Ni), a total TCR of the chip resistor may be decreased.

It may be seen from the graph of FIG. 8 that the resistor including copper-nickel (Cu—Ni) has the lowest TCR when a ratio of nickel (Ni) of copper-nickel (Cu—Ni) is 40% or more and 50% or less (e.g., in a range between 40% and 50%). Therefore, the chip resistor according to an exemplary embodiment includes the resistor having the ratio of nickel (Ni) that is 40% or more and 50% or less while including copper-nickel (Cu—Ni), whereby the total TCR may be significantly decreased.

Meanwhile, a negative TCR value indicates that when the temperature is increased, the resistance value is decreased. That is, the resistor including copper-nickel (Cu—Ni) may have characteristics that when the ratio of nickel (Ni) of copper-nickel (Cu—Ni) is in the range of 40% to 50% and the temperature is increased, the resistance value is decreased. Accordingly, by combining a resistor having a positive TCR characteristic and a resistor having a negative TCR characteristic, the TCR characteristics may offset each other to provide an overall zero (or near-zero) TCR characteristic. Note that the evaluation of whether a resistor has a positive or negative TCR is performed at room temperature (e.g., at a temperature in a range of 10-35° C.).

The chip resistor according to an exemplary embodiment may have a structure in which the first resistor has good thermo-electromotive force but has bad TCR characteristics and is connected in parallel with the second resistor that includes copper-nickel (Cu—Ni) in which the ratio of nickel (Ni) is 45% and has good TCR characteristics. A total resistance value and a total TCR of the chip resistor is determined according to the resistance value of the first resistor and the resistance value of the second resistor, and the total resistance value may be listed in the following Table 1.

In accordance with Table 1, when the resistance value of the second resistor is lower than the resistance value of the first resistor, TCR characteristics of the chip resistor may be better.

A reciprocal number of a total of resistance value of the chip resistor may be calculated by adding a reciprocal number of the resistance value of the first resistor to a reciprocal number of the resistance value of the second resistor. Accordingly, as the resistance value of the second resistor is lower than the resistance value of the first resistor, an effect on the total resistance value resulting from a change in the resistance value of the second resistor may be greater than an effect on the total resistance value resulting from a change in the resistance value of the first resistor. Therefore, as the resistance value of the second resistor is lower than the resistance value of the first resistor, a total TCR of the chip resistor may be closer to the TCR of the second resistor rather than the TCR of the first resistor.

For example, in the chip resistor of Case 1, the resistance value of the first resistor may be about equal to (e.g., equal to one time of) the resistance value of the second resistor. Here, a ratio of the TCR of the second resistor to the total TCR of the chip resistor may be about 50%.

In the chip resistor of Case 2, the resistance value of the first resistor may be about two times the resistance value of the second resistor. Here, a ratio of the TCR of the second resistor to the total TCR of the chip resistor may be about 67%.

Further, in the chip resistor of Case 3, the resistance value of the first resistor may be about three times the resistance value of the second resistor. Here, a ratio of the TCR of the second resistor to the total TCR of the chip resistor may be about 75%.

Referring to a progression of the ratio of the TCR of the second resistor to the total TCR of the chip resistor, in a case in which the resistance value of the second resistor is about five times the resistance value of the first resistor, it may be inferred that the total of TCR of the chip resistor reaches zero (0).

Therefore, in the chip resistor according to an exemplary embodiment, the resistance value of the second resistor may be designed to be three times or more and seven times or less

TABLE 1

| Classification | Material | 20° C. Only R | 20° C. a total of R | 125° C. a total of R | −55° C. a total of R | 20° C. to 125° C. TCR | −55° C. to 20° C. TCR |
|---|---|---|---|---|---|---|---|
| Case1 | Resistor 1 | 8 | 4 mΩ | 4.1 mΩ | 3.92 mΩ | 237 ppm/° C. | 259 ppm/° C. |
|  | Resistor 2 | 8 |  |  |  |  |  |
| Case2 | Resistor 1 | 12 | 4 mΩ | 4.05 mΩ | 3.96 mΩ | 122 ppm/° C. | 142 ppm/° C. |
|  | Resistor 2 | 6 |  |  |  |  |  |
| Case3 | Resistor 1 | 15 | 3.75 mΩ | 3.78 mΩ | 3.73 mΩ | 66 ppm/° C. | 82 ppm/° C. |
|  | Resistor 2 | 5 |  |  |  |  |  |
| Case4 | Resistor 1 | 5 | 3.75 mΩ | 3.91 mΩ | 3.63 mΩ | 415 ppm/° C. | 432 ppm/° C. |
|  | Resistor 2 | 15 |  |  |  |  |  |

In Table 1, R denotes a resistance value using a unit of mΩ, and TCR denotes a temperature coefficient of resistivity of a unit of ppm/temperature (e.g., ppm/° C.).

Figure 9:
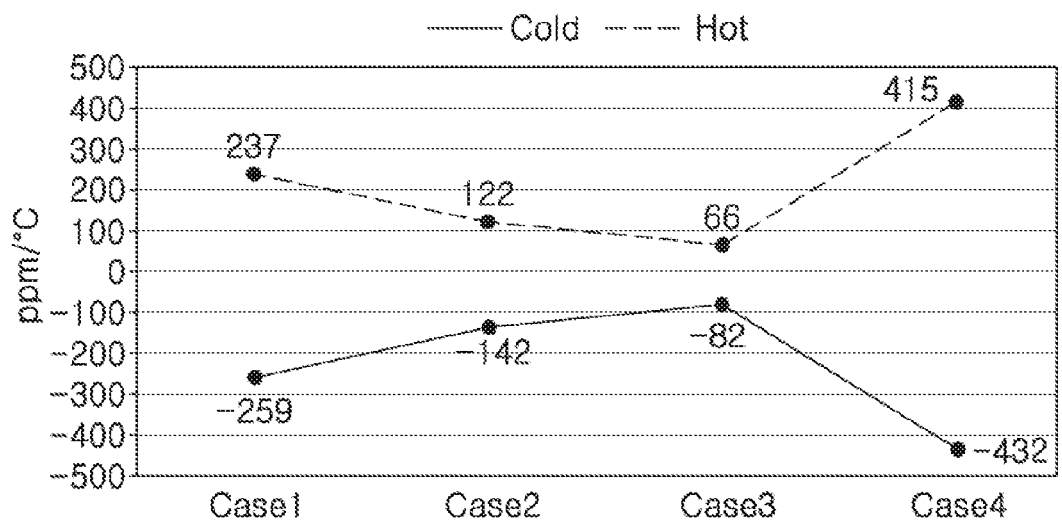
FIG. 9 is a graph illustrating the TCR of first and second resistors.

FIG. 9 is a graph illustrating the TCR of first and second resistors.

FIG. 9 illustrates in graph-form the TCR results shown in Table 1. Referring to FIG. 9, it may be seen that the chip resistor of Case 3 has the best TCR characteristics (e.g., the lowest TCR values).

(e.g., in a range of three to seven times) of the resistance value of the first resistor. Accordingly, the change in the resistance value depending on the temperature change of the chip resistor may be significantly decreased.

Figure 10:
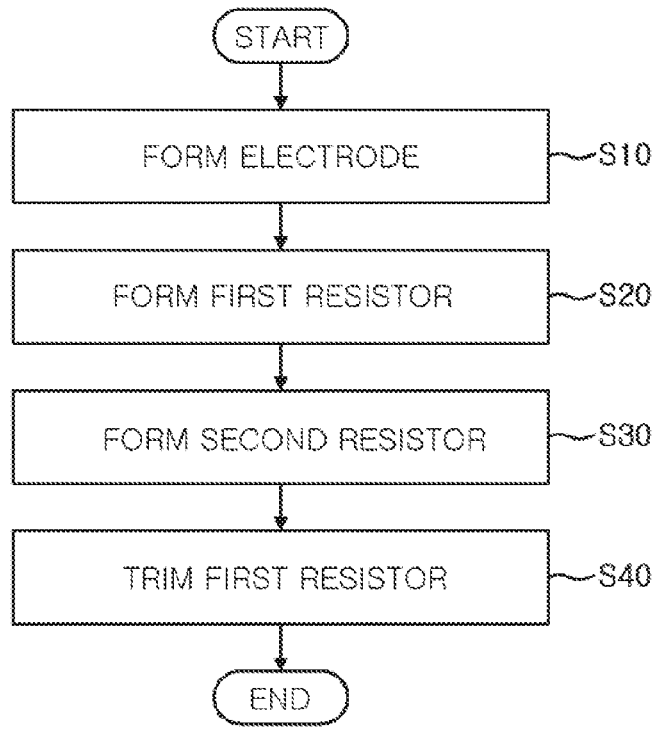
FIG. 10 is a flowchart illustrating a method of manufacturing a chip resistor according to an exemplary embodiment.

FIG. 10 is a flowchart illustrating a method of manufacturing a chip resistor according to an exemplary embodiment.

Referring to FIG. 10, a chip resistor according to an exemplary embodiment may be manufactured by an operation S10 of forming one or more electrodes (e.g., electrodes 221 and 222), an operation S20 of forming a first resistor (e.g., 231), an operation S30 of forming a second resistor (e.g., 232), and an operation S40 of trimming the first resistor.

The operation S10 of forming the electrode refers to an operation of painting, spraying, or printing a paste in an ink state on a substrate. The printing may be performed by a screen method. Accordingly, a thickness of the one or more electrode(s) may be precisely controlled.

The operation S20 of forming the first resistor refers to an operation of printing a resistor having good thermo electromotive force characteristics on the substrate.

The operation S30 of forming the second resistor refers to an operation of printing a resistor having good TCR characteristics on the substrate. A process from the operation S10 of forming the electrode to the operation S30 of forming the second resistor may be performed by a thick film process. Accordingly, a sintering of the electrode and the resistor may be performed in a reduction atmosphere at a temperature between 800° C. and 1400° C. Here, recrystallization of the resistor and the electrode may be performed, and a grain growth thereof may occur. In this case, electrical conductivity between the resistor and the electrode may be improved. Accordingly, the chip resistor according to an exemplary embodiment may be implemented to have a low resistance value of 100 mΩ or less.

The printing and the sintering of the paste may be repeated. Accordingly, initial resistance values of the electrode and the resistor may be optimized.

Further, the resistance value of the chip resistor may be adjusted by a method such as laser dicing, laser-etching, sand blasting, or the like after forming the electrode.

In the operation S40 of trimming the first resistor, a groove may be formed from an edge of the first resistor using a laser. In this case, a measurement of a total resistance value of the chip resistor may be performed at the same time as the trimming is performed. A length of the groove may be extended until the total resistance value of the chip resistor reaches a target resistance value.

As set forth above, according to the exemplary embodiments, the chip resistor may have high precision while having a low resistance value.

While exemplary embodiments have been shown and described above, it will be apparent to those skilled in the art that modifications and variations could be made without departing from the scope of the present invention as defined by the appended claims.

What is claimed is:

1. A chip resistor comprising:
    a substrate;
    a first electrode disposed on a surface of the substrate;
    a second electrode disposed on a surface of the substrate to be separated from the first electrode;
    a first resistor electrically connecting the first electrode to the second electrode; and
    a second resistor electrically connecting the first electrode to the second electrode,
    wherein thermo electromotive force generated from the first resistor is less than thermo electromotive force generated from the second resistor when temperatures of the first electrode and the second electrode are different from each other, and
    a temperature coefficient of resistivity (TCR) of the second resistor is lower than a TCR of the first resistor.

2. The chip resistor of claim 1, wherein the first resistor includes copper-manganese-tin (Cu—Mn—Sn), and
    the second resistor includes copper-nickel (Cu—Ni).

3. The chip resistor of claim 2, wherein a ratio of nickel (Ni) among copper-nickel (Cu—Ni) is between 40% and 50%.

4. The chip resistor of claim 3, wherein a resistance value of the first resistor is between 3 mΩ and 100 mΩ,
    a resistance value of the second resistor is between 1 mΩ and 34 mΩ, and
    the resistance value of the first resistor is between three times and seven times the resistance value of the second resistor.

5. The chip resistor of claim 1, wherein only the first resistor among the first and second resistors has a groove.

6. The chip resistor of claim 5, wherein the groove is formed at an edge of the first resistor that is disposed opposite to another edge of the first resistor that is closest the second resistor, and the groove has an "L" shape.

7. The chip resistor of claim 1, wherein a resistance value of the second resistor decreases when a temperature of the second resistor increases from a room temperature.

8. The chip resistor of claim 1, further comprising:
    a third electrode disposed on a surface of the substrate to be separated from the first electrode and the second electrode; and
    a third resistor disposed on a surface of the substrate and electrically connecting the third electrode to the second electrode.

9. The chip resistor of claim 1, further comprising:
    an upper surface electrode disposed on an upper surface of at least one of the first electrode, the second electrode, the first resistor, and the second resistor; and
    a protection layer covering an upper surface of at least one of the first electrode, the second electrode, the first resistor, the second resistor, and the upper surface electrode.

10. The chip resistor of claim 1, wherein the substrate has first and second surfaces,
    the first resistor is disposed on the first surface, and
    the second resistor is disposed on the second surface.

11. A chip resistor comprising:
    a substrate;
    a first electrode disposed on a surface of the substrate;
    a second electrode disposed on a surface of the substrate to be separated from the first electrode; and
    a plurality of resistors each disposed on a surface of the substrate to electrically connect the first electrode and the second electrode to each other and be electrically connected in parallel with each other,
    wherein a first resistor of the plurality of resistors has a groove, and a second resistor of the plurality of resistors has an average temperature coefficient of resistivity (TCR) that is lower than an average TCR of the remaining resistors of the plurality of resistors.

12. The chip resistor of claim 11, wherein the first resistor includes copper-manganese-tin (Cu—Mn—Sn),
    the second resistor includes copper-nickel (Cu—Ni), and
    a ratio of nickel (Ni) among copper-nickel (Cu—Ni) in the second resistor is between 40% and 50%.

13. The chip resistor of claim 12, wherein a total resistance value of the plurality of resistors is between 1 mΩ and 10 mΩ, and
    a resistance value of the first resistor is greater than a resistance value of each of the remaining resistors of the plurality of resistors.

14. The chip resistor of claim 11, wherein the plurality of resistors are disposed on the surface of the substrate such that a resistor including copper-manganese-tin (Cu—Mn—

Sn) and a resistor including copper-nickel (Cu—Ni) are repeatedly alternately arranged on the surface.

15. The chip resistor of claim 14, wherein the plurality of resistors are in direct contact with each other.

16. The chip resistor of claim 11, wherein the first resistor is disposed between two resistors of the plurality of resistors.

17. A method of forming a chip resistor having a predetermined resistance value comprising:
   forming on a substrate first and second electrodes disposed to be spaced apart from each other;
   disposing a first resistor on the substrate to directly contact and electrically connect the first electrode and the second electrode;
   disposing a second resistor on the substrate to electrically connect the first electrode to the second electrode, wherein a thermo electromotive force generated from the first resistor is lower than a thermo electromotive force generated from the second resistor when temperatures of the first electrode and the second electrode are different from each other; and
   trimming the first resistor having the lower electromotive force to achieve the predetermined resistance value.

18. The method of claim 17, wherein the trimming the first resistor comprises forming an L-shaped groove in the first resistor to achieve the predetermined resistance value.

19. The method of claim 18, wherein the trimming the first resistor comprises trimming only the first resistor having the lower electromotive force among the first and second resistors.

20. The method of claim 17, wherein the first resistor is trimmed to have a resistance value that is between three times and seven times the resistance value of the second resistor.

21. The method of claim 17, wherein the first and second resistors are disposed on a same surface of the substrate, and the trimming of the first resistor comprises trimming an edge of the first resistor other than an edge of the first resistor disposed closest to the second resistor.

22. The method of claim 17, further comprising:
   disposing a third resistor on the substrate to electrically connect the first electrode to the second electrode,
   wherein the first, second, and third resistors are disposed on a same surface of the substrate, the first resistor has lower heat dissipation capacity than either of the second and third resistors, and the first resistor having the lower heat dissipation capacity is disposed between the second and third resistors on the same surface of the substrate.

23. The method of claim 22, wherein the first resistor directly contacts each of the second and third resistors.

24. The method of claim 17, wherein the forming the first and second electrodes comprises forming the first and second electrodes to cover respective side surfaces of the substrate adjacent to an upper surface having the first resistor disposed thereon.

25. The method of claim 17, wherein the disposing the second resistor comprises disposing the second resistor on a first surface of the substrate opposite to a second surface having the first resistor disposed thereon.

26. The method of claim 25, wherein the forming the first and second electrodes comprises forming the first and second electrodes to each extend from the first surface to the second surface of the substrate and to cover respective side surfaces of the substrate adjacent to the first and second surfaces respectively having the first resistor disposed thereon.

27. The method of claim 17, further comprising:
   forming a third electrode on a same surface of the substrate having the first and second electrodes, the third electrode being disposed to be spaced apart from each of the first and second electrodes; and
   disposing a third resistor on the substrate to directly contact and electrically connect the second electrode and the third electrode.

28. A chip resistor comprising:
   a substrate;
   a first electrode disposed on a surface of the substrate;
   a second electrode disposed on a surface of the substrate to be separated from the first electrode; and
   a plurality of resistors each disposed on a surface of the substrate to electrically connect the first electrode and the second electrode to each other and be electrically connected in parallel with each other,
   wherein a first resistor of the plurality of resistors has a temperature coefficient of resistivity (TCR) that differs from a TCR of a second resistor of the plurality of resistors.

29. The chip resistor of claim 28, wherein the first resistor of the plurality of resistors has a thermo electromotive force that differs from a thermo electromotive force of the second resistor of the plurality of resistors when temperatures of the first electrode and the second electrode are different from each other.

30. The chip resistor of claim 28, wherein the first and second resistors of the plurality of resistors have TCRs of different positive and negative polarities respectively.

31. The chip resistor of claim 28, wherein the first resistor of the plurality of resistors has a TCR that is higher than TCRs of all other resistors electrically connected in parallel therewith.

32. The chip resistor of claim 31, wherein the first resistor having the higher TCR is the only resistor among the plurality of resistors having a groove formed therein.

33. The chip resistor of claim 31, wherein the first resistor having the higher TCR is disposed between the second resistor and a third resistor of the plurality of resistors on a surface of the substrate.

34. The chip resistor of claim 33, wherein the first resistor having the higher TCR contacts the second and third resistors on opposite sides thereof.

35. The chip resistor of claim 33, wherein the first resistor disposed between the second and third resistors is the only resistor among the first, second, and third resistors having a groove formed therein.

* * * * *